(12) United States Patent
Imato et al.

(10) Patent No.: US 7,190,010 B2
(45) Date of Patent: Mar. 13, 2007

(54) SEMICONDUCTOR DEVICE

(75) Inventors: Takachika Imato, Hyogo (JP); Hiroshi Matsuoka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 149 days.

(21) Appl. No.: 11/011,140

(22) Filed: Dec. 15, 2004

(65) Prior Publication Data

US 2005/0224846 A1  Oct. 13, 2005

(30) Foreign Application Priority Data

Apr. 6, 2004 (JP) .............................. 2004-112255

(51) Int. Cl.
*H01L 31/113* (2006.01)
(52) U.S. Cl. ................. 257/288; 257/473; 257/383
(58) Field of Classification Search ........... 257/288, 257/473, 383
See application file for complete search history.

(56) References Cited

U.S. PATENT DOCUMENTS 5,923,072 A  7/1999 Wada et al.
6,870,232 B1 *  3/2005 Chan et al. ............... 257/384

2002/0180005 A1  12/2002 Haematsu

FOREIGN PATENT DOCUMENTS

| JP | 5-166803 | 7/1993 |
|----|----------|--------|
| JP | 5-159560 | 8/1993 |
| JP | 5-218016 | 8/1993 |
| JP | 5-234990 | 9/1993 |
| JP | 5-299638 | 11/1993 |
| JP | 7-321127 | 12/1995 |
| JP | 7-326632 | 12/1995 |
| JP | 11-87345 | 3/1999 |

* cited by examiner

*Primary Examiner*—Andy Huynh
*Assistant Examiner*—Thinh T Nguyen
(74) *Attorney, Agent, or Firm*—Leydig, Voit & Mayer, Ltd.

(57) ABSTRACT

A semiconductor device includes a semiconductor substrate, a T-shaped gate electrode, a moisture-proof insulating film, and an interlayer dielectric film. The T-shaped gate electrode has a leg portion joined to the semiconductor substrate and an overhanging head portion spaced from the semiconductor substrate. The T-shaped gate electrode includes a gate metal containing a material reactive with water. The moisture-proof insulating film is located only in the vicinity of the leg portion and covers a side surface of the leg portion of the T-shaped gate electrode. The interlayer dielectric film is located between the overhanging head portion of the T-shaped gate electrode and the semiconductor substrate and has a dielectric constant that is lower than that of the moisture-proof insulating film.

5 Claims, 5 Drawing Sheets

SEMICONDUCTOR DEVICE

BACKGROUND OF THE INVENTION

1. Field of the Invention

The present invention relates to a semiconductor device having a T-shaped gate electrode and a manufacturing method thereof and, more particularly, to a semiconductor device that allows moisture resistance to be improved without causing an increased parasitic capacitance, and a manufacturing method thereof.

2. Background Art

A T-shaped gate electrode is formed by shaping a gate metal having two layers of, for example, WSi and Au, so that its section is T-shaped. The T-shaped section makes it possible to reduce the resistance of the gate electrode.

A manufacturing method of a conventional semiconductor device having the T-shaped gate electrode will be described.

First, a spacer film is deposited on a semiconductor substrate, and a groove is formed in the spacer film by a selective dry etching process. Then, a gate metal is deposited on the entire surface by a sputtering process.

Next, the region corresponding to the overhanging head portion of the gate electrode is covered by a photoresist, and the gate metal is dry-etched using the photoresist. Then, removing the photoresist and the spacer film creates the T-shaped gate electrode. Thereafter, an interlayer dielectric film is formed by a plasma chemical vapor deposition (CVD) process to cover the entire T-shaped gate electrode.

It is, however, impossible to evenly form the interlayer dielectric film on the leg portion and around the region underneath the bottom surface of the overhanging head portion of the gate electrode, since the gate electrode is T-shaped. For this reason, moisture enters through the leg portion and the bottom surface of the overhanging head portion of the gate electrode, and the WSi layer of the gate metal is eventually oxidized and corroded, leading to deteriorated characteristics of a field-effect transistor using the T-shaped gate electrode.

To solve such a problem, there has been proposed a semiconductor device with improved moisture resistance achieved by covering side surfaces of the leg portion of the gate electrode with a moisture-proof insulating film and by covering the bottom surface of the overhanging head portion of the gate electrode by a moisture-proof metal film (refer to, for example, Japanese Unexamined Patent Application Publication No. 5-299638).

In the conventional semiconductor device, the moisture-proof insulating film extends between the overhanging head portion of the gate electrode and the substrate rather than only in the vicinity of the leg portion of the gate electrode. The moisture-proof insulating film has a high dielectric constant, so that parasitic capacitance unavoidably increases, posing a problem of deterioration in the characteristics of the field-effect transistor having the gate electrode.

In addition, the conventional semiconductor device is not provided with a moisture-proof metal film on the side surfaces of the overhanging head portion of the gate electrode. Hence, intrusion by moisture through the side surfaces of the overhanging head portion oxidizes and corrodes the WSi layer of the gate metal, presenting the problem of deterioration in the characteristics of the field-effect transistor having the gate electrode.

SUMMARY OF THE INVENTION

The present invention has been made with a view toward solving the problems described above, and it is an object of the invention to provide a semiconductor device that permits improved moisture resistance to be achieved without causing an increased parasitic capacitance, and a manufacturing method thereof.

According to one aspect of the present invention, a semiconductor device includes a semiconductor substrate, a T-shaped gate electrode, a moisture-proof insulating film, and an interlayer dielectric film. The T-shaped gate electrode has a leg portion joined to the semiconductor substrate and an overhanging head portion spaced away from the semiconductor substrate. The T-shaped gate electrode is formed of a gate metal containing a material reactive with water. The moisture-proof insulating film is provided only in the vicinity of the leg portion to cover a side surface of the leg portion of the T-shaped gate electrode. The interlayer dielectric film is provided between the overhanging head portion of the T-shaped gate electrode and the semiconductor substrate and has a dielectric constant that is lower than that of the moisture-proof insulating film.

Other and further objects, features and advantages of the invention will appear more fully from the following description.

The features and advantages of the present invention may be summarized as follows.

As described above, the present invention allows moisture resistance to be improved without causing an increase in parasitic capacitance.

DETAILED DESCRIPTION OF THE PREFERRED EMBODIMENTS

First Embodiment

A manufacturing method of a semiconductor device according to a first embodiment of the present invention will be described in conjunction with the accompanying drawings.

Figure 1A:
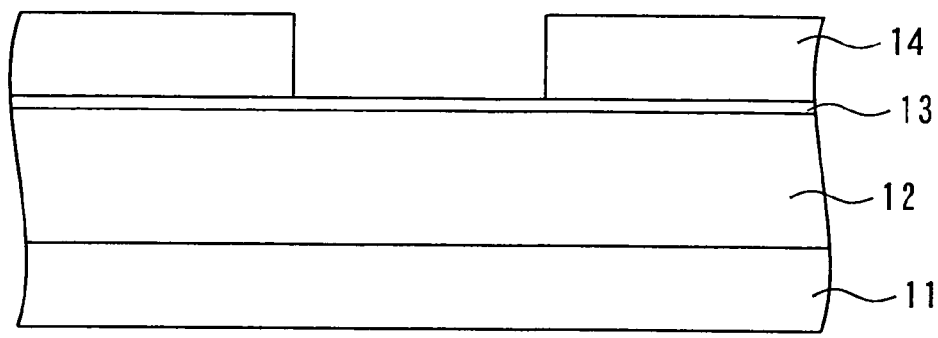
FIGS. 1A–1C, 2A, 2B, 3A and 3B show a manufacturing method of a semiconductor device according to a first embodiment of the present invention.

First, as shown in FIG. 1A, a spacer film 12 made of $SiO_2$ is deposited on a semiconductor substrate 11 made of, for example, GaAs. Then, an Au film 13 serving as a first moisture-proof metal film is formed on the spacer film 12 by a sputtering process. Subsequently, a photoresist 14 having an opening in a region corresponding to a leg portion of a gate electrode is deposited on the Au film 13.

Figure 1B:
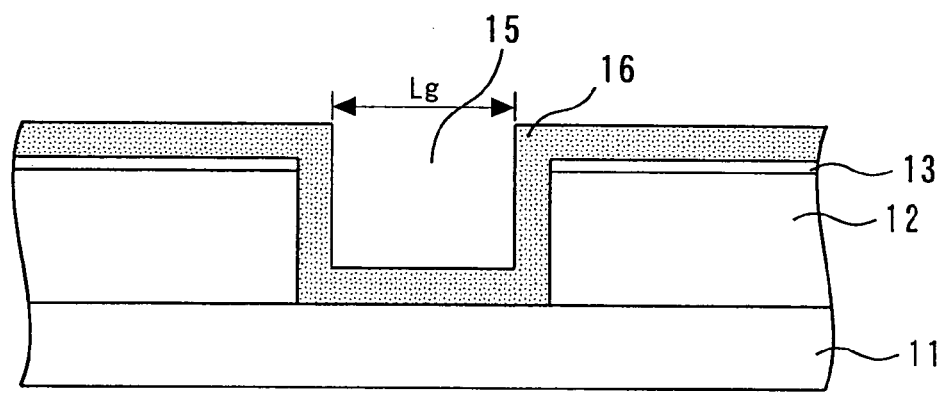

Next, using the photoresist 14 as a mask, the Au film 13 and the spacer film 12 are selectively dry-etched to form an opening 15 in a portion corresponding to the leg portion of the T-shaped gate electrode. The photoresist 14 is removed, and then a moisture-proof insulating film 16, which is made of a SiN dense film and which hardly passes moisture, is deposited on the entire surface, as shown in FIG. 1B.

Figure 1C:
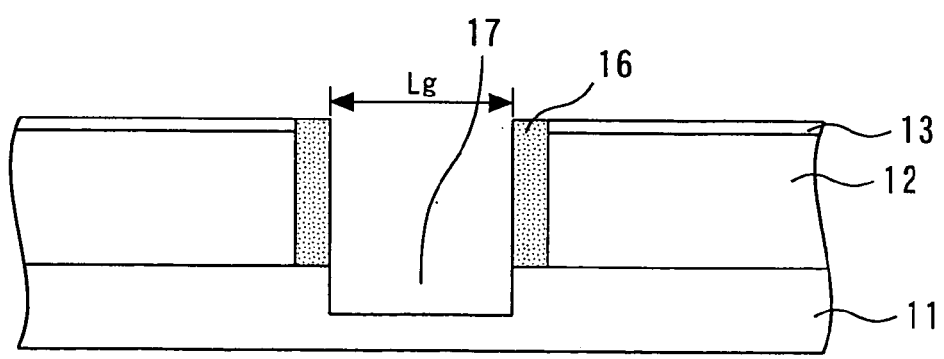

Next, as shown in FIG. 1C, the moisture-proof insulating film 16 is removed by a dry etching process, leaving it only on the side surface of the opening 15. Thus, the moisture-proof insulating film 16 is formed on the side wall of the opening 15. Then, a recess 17 is formed by the selective dry etching process in the semiconductor substrate 11 exposed at the bottom of the opening 15.

Figure 2A:
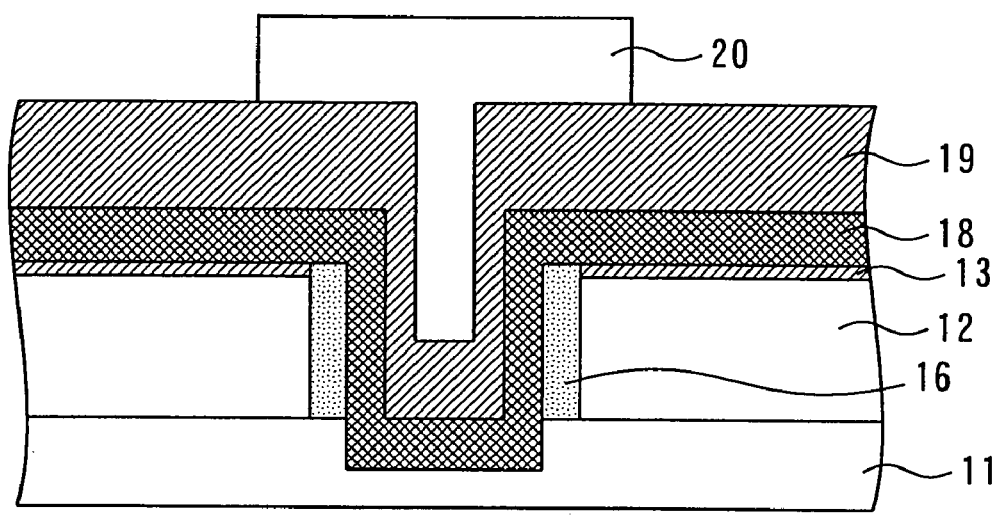

In the next step, as shown in FIG. 2A, a WSi film 18 is formed on the entire surface by the sputtering process, and then an Au film 19 is formed on the WSi film 18 by the sputtering process. This produces a gate metal containing WSi, which is an ingredient reactive with water. Thereafter, a photoresist 20 is deposited to cover the region corresponding to the overhanging head portion of the gate electrode.

Figure 2B:
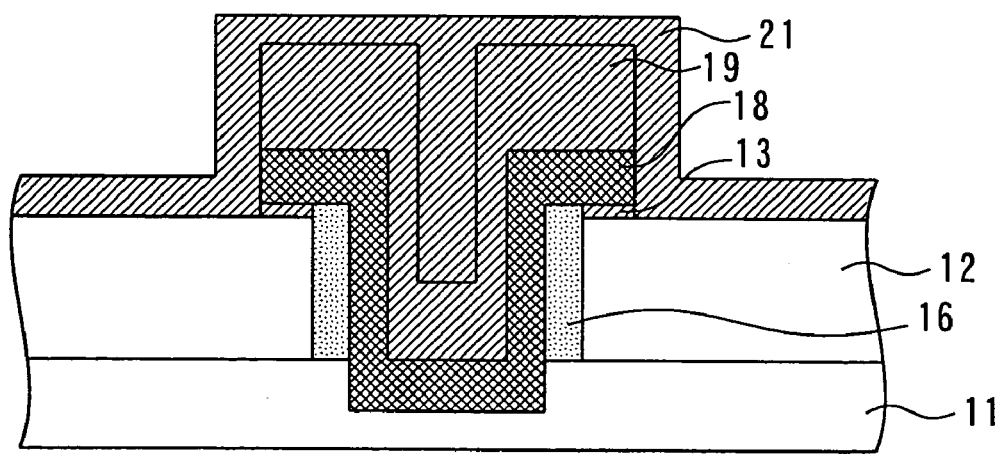

In the next step, using the photoresist 20 as a mask, the Au film 19, the WSi film 18, and the Au film 13 are dry-etched. Thus, the T-shaped gate electrode is formed. Thereafter, as shown in FIG. 2B, the photoresist 20 is removed, and then the Au film 21 is formed on the entire surface by the sputtering process.

Figure 3A:
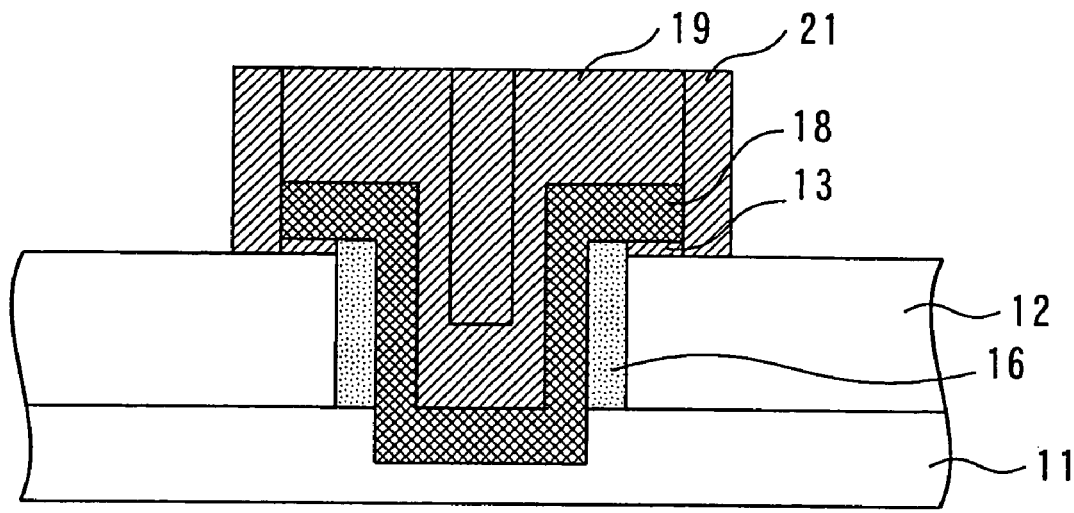

Next, as shown in FIG. 3A, the Au film 21 is removed by the dry etching process such that it is left only on the side surfaces of the overhanging head portion of the T-shaped gate electrode. This produces the Au film 21 on the side walls of the overhanging head portion of the T-shaped gate electrode.

Figure 3B:
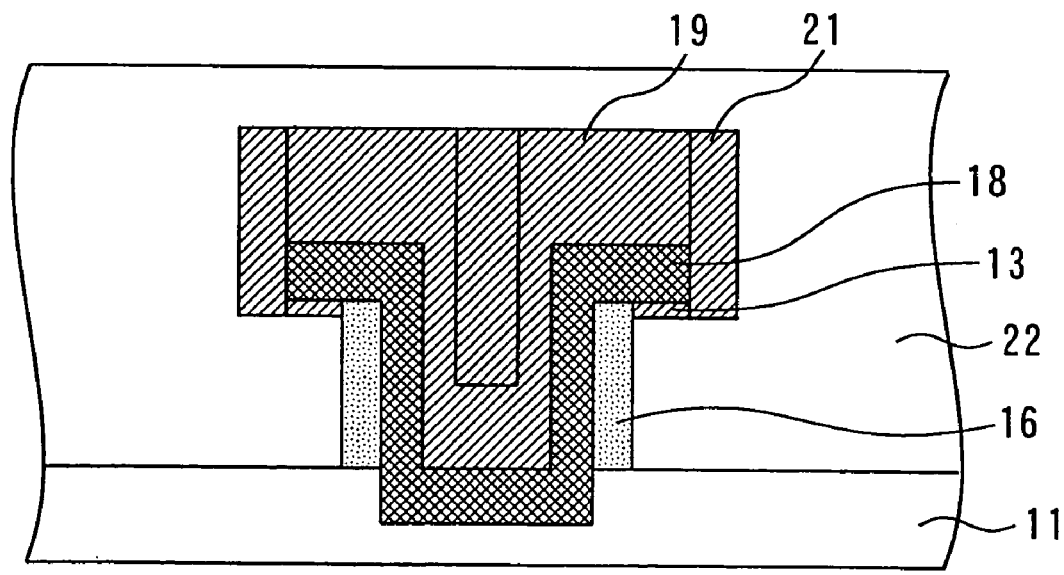

Lastly, as shown in FIG. 3B, only the spacer film 12 is removed by the selective etching process. Then, an interlayer dielectric film 22 is formed so that it covers the entire T-shaped gate electrode, including the area between the overhanging head portion of the T-shaped gate electrode and the semiconductor substrate. The interlayer dielectric film 22 has a dielectric constant that is lower than that of the moisture-proof insulating film. As the interlayer dielectric film 22, a fluorine-doped silicon oxide film (FSG film), for example, is produced by a plasma CVD process using $SiF_4$ and $O_2$.

The semiconductor device fabricated by the process described above has a semiconductor substrate and a T-shaped gate electrode formed of a leg portion brought into Schottky junction with the semiconductor substrate and an overhanging head portion spaced from the semiconductor substrate. The T-shaped gate electrode also includes a gate metal that contains an ingredient reactive with water, and further includes a moisture-proof insulating film provided only in the vicinity of the leg portion such that it covers the side surfaces of the leg portion of the T-shaped gate electrode, and the interlayer dielectric film having a dielectric constant that is lower than that of the moisture-proof insulating film, the interlayer dielectric film being provided between the overhanging head portion of the T-shaped gate electrode and the semiconductor substrate.

As described above, covering the side surfaces of the leg portion of the T-shaped gate electrode by the moisture-proof insulating film 16 makes it possible to restrain moisture from entering from outside, thus permitting improved moisture resistance to be achieved. Moreover, it is possible to restrain an increase in parasitic capacitance by providing the moisture-proof insulating film having a high dielectric constant only in the vicinity of the leg portion and by providing the interlayer dielectric film having a dielectric constant that is lower than that of the moisture-proof insulating film between the overhanging head portion of the T-shaped gate electrode and the semiconductor substrate.

The Au film 13 makes it possible to restrain moisture from entering through the bottom surface of the overhanging head portion of the T-shaped gate electrode. In addition, the Au film 21 makes it possible to restrain moisture from entering through side surfaces of the T-shaped gate electrode.

The description has been given of the case where gold, which is a metal resistant to oxidization and corrosion, is used as the material for the Au film 13, the Au film 19, and the Au film 21. However, any other metals may be used as long as they provide the same advantages. For example, W, Mo, Ni, Cr, or Ti/Au/Ti may be used in place of Au.

The improved moisture resistance permits use of an inexpensive package with less airtightness. This in turn permits reduced manufacturing cost.

Second Embodiment

A manufacturing method of a semiconductor device according to a second embodiment of the present invention will now be described in conjunction with the accompanying drawings. The same components as those shown in FIGS. 1A–1C will be assigned the same reference numerals and the descriptions thereof will be omitted.

Figure 4A:
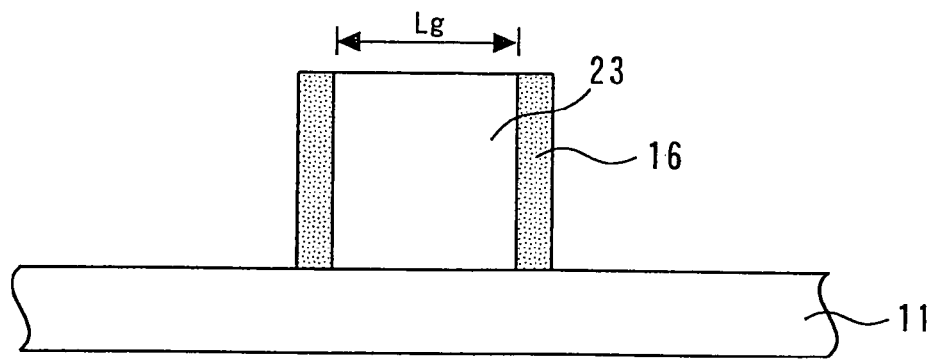
FIGS. 4A–4C show a manufacturing method of a semiconductor device according to a second embodiment of the present invention.

First, a dummy pattern 23 formed of $SiO_2$ is formed in the region corresponding to a leg portion of a T-shaped gate electrode on a semiconductor substrate 11, as shown in FIG. 4A. Then, a moisture-proof insulating film 16 is formed on a side wall of the dummy pattern 23.

Figure 4B:
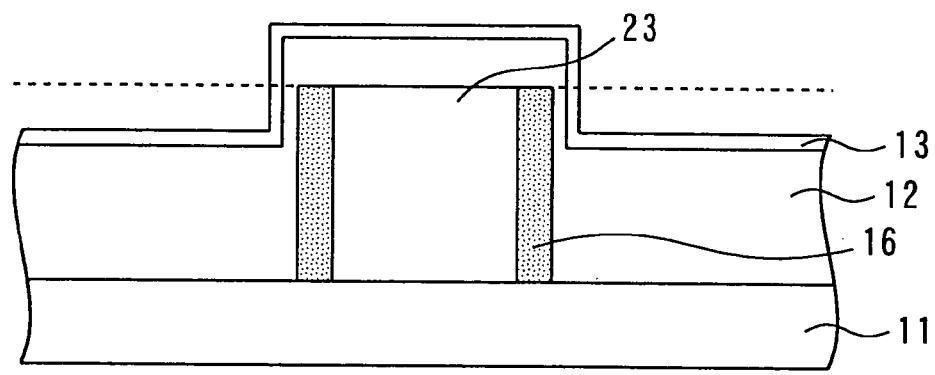

Then, a spacer film 12 is deposited on the entire surface, as shown in FIG. 4B, and then an Au film 13, which is a first moisture-proof metal film, is formed on the entire surface.

Next, a planarizing process based on a CMP process is carried out until the dummy pattern 23 is exposed. In this case, a polishing process is carried out by the CMP process until the level indicated by the dashed line in FIG. 4B is reached.

Figure 4C:
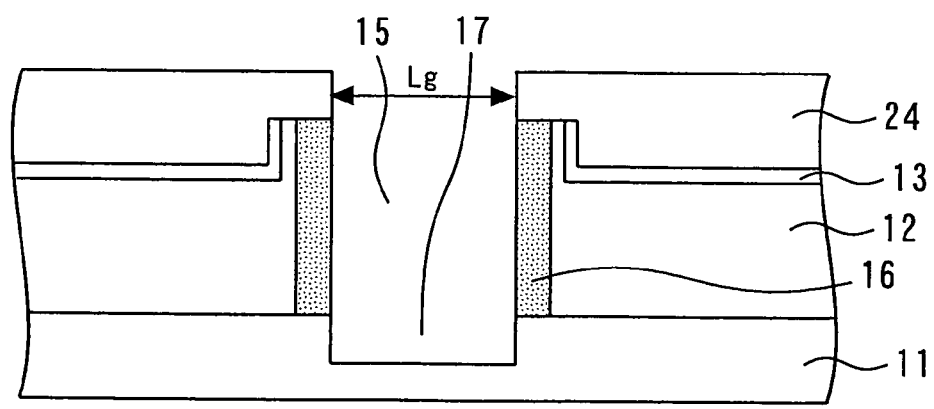

Subsequently, as shown in FIG. 4C, a photoresist 24 is formed that has an opening in a region corresponding to the leg portion of the T-shaped gate electrode. Using the photoresist 24 as a mask, the dummy pattern 23 is dry-etched to form an opening 15. Next, a recess 17 is formed by the selective dry etching process in the semiconductor substrate 11 exposed at the bottom of the opening 15.

The photoresist 24 is removed, and then the same processing as that illustrated in FIGS. 2A, 2B, 3A and 3B in the first embodiment is implemented to fabricate a semiconductor device similar to the one according to the first embodiment.

As described above, by forming the dummy pattern corresponding to the leg portion of the gate electrode and then by forming the recess in the semiconductor substrate exposed by the dry etching process, the width of the recess can be matched to the width of the leg portion of the gate electrode. Hence, the manufacturing method of a semiconductor device according to the second embodiment of the present invention improves controllability of the selective dry etching process when forming a recess.

Third Embodiment

A manufacturing method of a semiconductor device according to a third embodiment of the present invention will now be described in conjunction with the accompanying drawings. The same components as those shown in FIGS. 1A–1C will be assigned the same reference numerals and the descriptions thereof will be omitted.

Figure 5A:
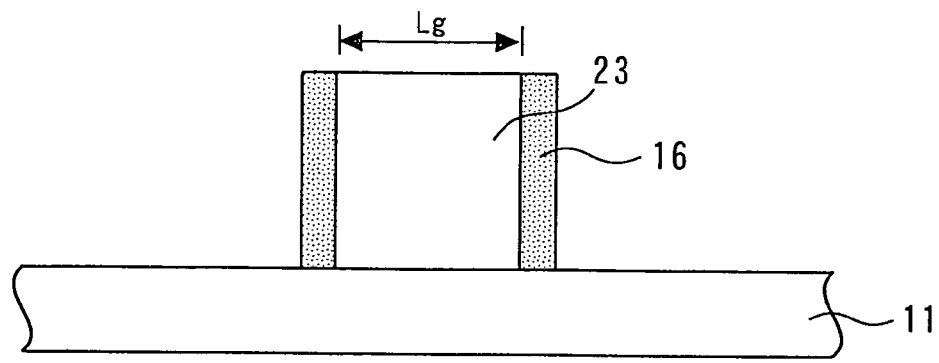
FIGS. 5A–5C show a manufacturing method of a semiconductor device according to a third embodiment of the present invention.

First, a dummy pattern 23 formed of $SiO_2$ is formed in a region corresponding to a leg portion of a T-shaped gate electrode on a semiconductor substrate 11, as shown in FIG. 5A. Then, a moisture-proof insulating film 16 is formed on a side wall of the dummy pattern 23.

Figure 5B:
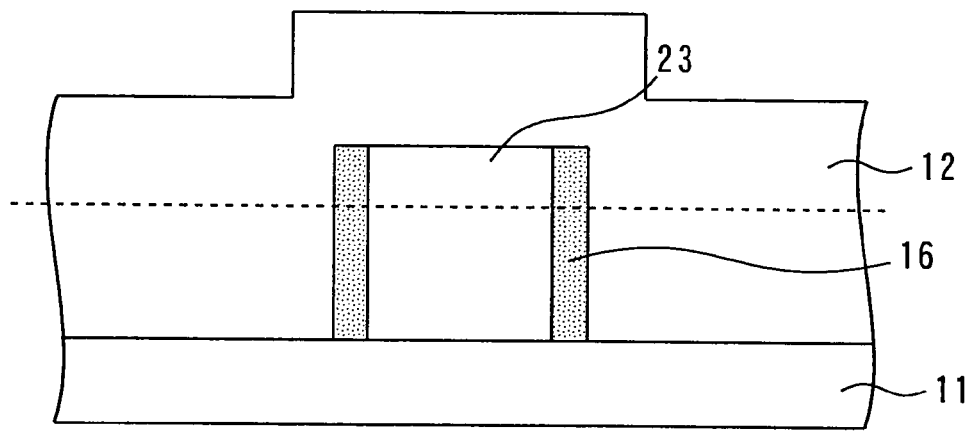

Next, a spacer film 12 is formed on the entire surface, as shown in FIG. 5B. Then, a planarizing process based on the CMP process is carried out until the dummy pattern 23 is exposed. In this case, polishing is carried out by the CMP process until the level indicated by the dashed line in FIG. 5B is reached.

Figure 5C:
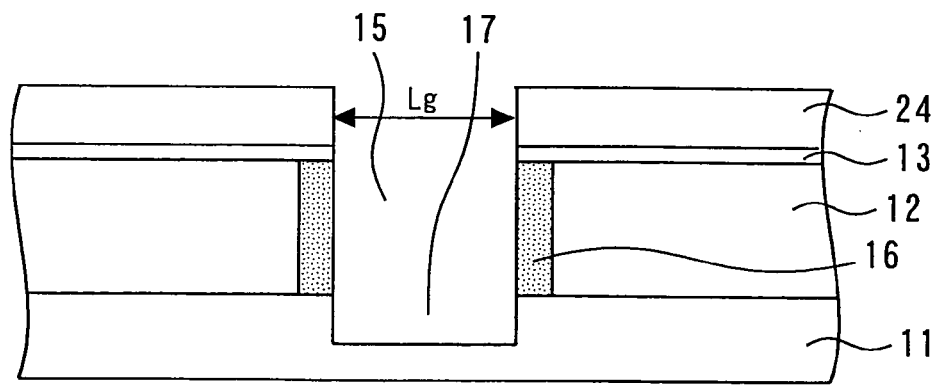

Subsequently, as shown in FIG. 5C, an Au film 13 serving as a first moisture-proof metal film is formed on the entire surface. Then, a photoresist 24 that has an opening in a region corresponding to the leg portion of the T-shaped gate electrode is formed. Using the photoresist 24 as a mask, the dummy pattern 23 is dry-etched to form an opening 15. Next, a recess 17 is formed by the selective dry etching process in the semiconductor substrate 11 exposed at the bottom of the opening 15.

The photoresist 24 is removed, and then the same processing as that illustrated in FIGS. 2A, 2B, 3A and 3B in the first embodiment is implemented to fabricate a semiconductor device similar to the one according to the first embodiment.

In the manufacturing method of a semiconductor device according to the third embodiment of the present invention, the entire surface is planarized by the CMP process, thus making it possible to improve accuracy of mask matching for the photoresist 24. Hence, the controllability of the selective dry etching process when forming a recess is further improved over the controllability in the second embodiment.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2004-112255, filed on Apr. 6, 2004 including specification, claims, drawings and summary, on which the Convention priority of the present application is based, are incorporated herein by reference in its entirety.

What is claimed is:

1. A semiconductor device comprising:
   a semiconductor substrate;
   a T-shaped gate electrode including a leg portion joined to the semiconductor substrate and an overhanging head portion spaced from the semiconductor substrate, the T-shaped gate electrode containing a material reactive with water;
   a moisture-proof insulating film located only in the vicinity of the leg portion and covering a side surface of the leg portion of the T-shaped gate electrode;
   an interlayer dielectric film located between the overhanging head portion of the T-shaped gate electrode and the semiconductor substrate and having a dielectric constant lower than that of the moisture-proof insulating film; and
   a first moisture-proof metal film that covers a bottom surface of the overhanging head portion of the T-shaped gate electrode that faces the semiconductor substrate.

2. A semiconductor device comprising:
   a semiconductor substrate;
   a T-shaped gate electrode including a leg portion joined to the semiconductor substrate and an overhanging head portion spaced from the semiconductor substrate, the T-shaped gate electrode containing a material reactive with water;
   a moisture-proof insulating film located only in the vicinity of the leg portion and covering a side surface of the leg portion of the T-shaped gate electrode;
   an interlayer dielectric film located between the overhanging head portion of the T-shaped gate electrode and the semiconductor substrate and having a dielectric constant lower than that of the moisture-proof insulating film; and
   a moisture-proof metal film that covers a side surface of the overhanging head portion of the T-shaped gate electrode.

3. The semiconductor device according to claim 1, further comprising a second moisture-proof metal film that covers a side surface of the overhanging head portion of the T-shaped gate electrode.

4. The semiconductor device according to claim 1 wherein the moisture-proof insulating film is a SiN film.

5. The semiconductor device according to claim 2 wherein the moisture-proof insulating film is a SiN film.

* * * * *